United States Patent
Hancock (10) Patent No.: US 9,294,077 B2
(45) Date of Patent: Mar. 22, 2016

(54) METHOD AND CIRCUIT FOR INJECTING A PRECISE AMOUNT OF CHARGE ONTO A CIRCUIT NODE

(71) Applicant: California Institute of Technology, Pasadena, CA (US)

(72) Inventor: Bruce R. Hancock, Altadena, CA (US)

(73) Assignee: California Institute of Technology, Pasadena, CA (US)

( * ) Notice: Subject to any disclaimer, the term of this patent is extended or adjusted under 35 U.S.C. 154(b) by 280 days.

(21) Appl. No.: 13/949,938

(22) Filed: Jul. 24, 2013

(65) Prior Publication Data
US 2014/0027610 A1 Jan. 30, 2014

Related U.S. Application Data (60) Provisional application No. 61/675,145, filed on Jul. 24, 2012.

(51) Int. Cl.
| | |
|---|---|
| *H03K 17/78* | (2006.01) |
| *H01L 27/00* | (2006.01) |
| *H03K 3/353* | (2006.01) |
| *G01J 1/44* | (2006.01) |
| *H01L 27/146* | (2006.01) |
| *H04N 5/369* | (2011.01) |
| *H04N 5/30* | (2006.01) |
| *G01J 1/46* | (2006.01) |

(52) U.S. Cl.
CPC . *H03K 3/353* (2013.01); *G01J 1/44* (2013.01); *G01J 1/46* (2013.01); *H01L 27/146* (2013.01); *H04N 5/30* (2013.01); *H04N 5/369* (2013.01)

(58) Field of Classification Search
USPC ............... 250/208.1, 214 R, 214.1, 214 SW; 348/294, 297–324, 332; 257/225, 229, 257/230, 231, 236, 238, 239, 242, 245, 257, 257/258, 290–310, 414, 431–466
See application file for complete search history.

(56) References Cited

U.S. PATENT DOCUMENTS 7,750,958 B1 * 7/2010 Dierickx ...................... 348/294

OTHER PUBLICATIONS

Maricic, D., "Image Sensors Employing Oversampling Sigma-Delta Analog-to-Digital Conversion with High Dynamic Range and Low Power", PhD Thesis, Department of Electrical and Computer Engineering Arts, Sciences and Engineering, Edmund A. Hajim School of Engineering and Applied Sciences. University of Rochester, Rochester, NY.

* cited by examiner

*Primary Examiner* — Pascal M Bui Pho
(74) *Attorney, Agent, or Firm* — Gates & Cooper LLP (57) ABSTRACT

A method and circuit for injecting charge into a circuit node, comprising (a) resetting a capacitor's voltage through a first transistor; (b) after the resetting, pre-charging the capacitor through the first transistor; and (c) after the pre-charging, further charging the capacitor through a second transistor, wherein the second transistor is connected between the capacitor and a circuit node, and the further charging draws charge through the second transistor from the circuit node, thereby injecting charge into the circuit node.

18 Claims, 6 Drawing Sheets

METHOD AND CIRCUIT FOR INJECTING A PRECISE AMOUNT OF CHARGE ONTO A CIRCUIT NODE

CROSS REFERENCE TO RELATED APPLICATIONS

This application claims the benefit under 35 U.S.C. Section 119(e) of the following commonly-assigned application:

U.S. Provisional Patent Application Ser. No. 61/675,145, filed on Jul. 24, 2012, by Bruce R. Hancock, entitled "PRECISION CHARGE INJECTOR," which application is incorporated by reference herein.

STATEMENT REGARDING FEDERALLY SPONSORED RESEARCH AND DEVELOPMENT

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to method and apparatus for injecting charge in a circuit.

2. Description of the Related Art

A number of applications, notably in-pixel analog-to-digital conversion based on sigma-delta techniques, require a circuit that can precisely inject a very small amount of charge onto a node. The injected charge must be low noise, repeatable, controllable, reproducible from cell to cell, and insensitive to the node voltage. Furthermore, the circuit must be compact and low power. The present invention satisfies this need.

SUMMARY OF THE INVENTION

The present invention discloses a method for injecting charge into a circuit node, comprising (a) resetting a capacitor's voltage through a first transistor; (b) after the resetting, pre-charging the capacitor through the first transistor; and (c) after the pre-charging, further charging the capacitor through a second transistor, wherein: the second transistor is connected between the capacitor and a circuit node or output, and the further charging draws charge through the second transistor from the circuit node or output, thereby injecting charge into the circuit node or output.

The transistors can be field effect transistors, the method further comprising (1) biasing a first gate of the first transistor at a fixed voltage $V_{pre}$ above the first transistor's threshold voltage $V_{t1}$; (2) biasing a second gate of the second transistor at a voltage below the second transistor's threshold voltage $V_{t2}$; (3) performing the resetting step, comprising bringing a drain of the first transistor to a reset voltage $V_{rst} < V_{pre} - V_{t1}$ wherein the first transistor operates in a linear resistive regime and the capacitor is discharged to $V_{rst}$; (4) performing the pre-charging step, comprising raising the drain of the first transistor to a voltage $V_{dd}$, which brings the first transistor into saturation and wherein the capacitor is charged to $V_{pre} - V_{t1}$; and (5) performing the further charging step, comprising raising the second gate to an injection Voltage $V_{inj} > V_{pre}$ wherein the capacitor is charged to $V_{inj} - V_{t2}$ and a charge $Q = C(V_{inj} - V_{pre} + V_{t1} - V_{t2})$ is injected through a drain of the second transistor into the circuit node and C is a capacitance of the capacitor.

The threshold voltages of the first transistor and second transistor can be matched such that $V_{t1} = V_{t2}$ and $Q = C(V_{inj} - V_{pre})$. In one embodiment, $(V_{inj} - V_{pre} + V_{t1} - V_{t2}) > kT/q$ or $V_{t1} = V_{t2}$ and $(V_{inj} - V_{pre}) > kT/q$, where k is Boltzmann's constant ($1.3806488 \times 10^{-23}$ K m²kg s⁻² K⁻¹), T is temperature (Kelvin), and q is charge on an electron ($1.60217657 \times 10^{-19}$ coulombs (C)).

Channel lengths of the transistors can be selected such that $(V_{inj} - V_{pre} + V_{t1} - V_{t2}) > kT/q$ or $V_{t1} = V_{t2}$ and $(V_{inj} - V_{pre}) > kT/q$ includes contributions due to the channel lengths' modulation by one or more of the drain voltages.

The pre-charging can produce a soft reset of the capacitor when the first transistor goes into a sub-threshold regime during or due to the pre-charging, the method further comprising increasing $V_{rst}$ in order to increase a time in the soft reset, or such that the time in soft reset is maximized.

The first transistor, the second transistor, and $V_{rst}$ can be selected such that the soft reset persists long enough during the charging steps to reduce a variance of the injected charge to no more than kTC.

The first transistor, the second transistor, and $V_{rst}$ can be selected such that the injecting of charge is shot noise limited.

The $V_{rst}$, $V_{pre}$, and $V_{inj}$ can be such that the injected charge is 10,000 times an electron charge or less.

The method can performing multiple cycles comprising the resetting, precharging, and injecting, or resetting and precharging, and provide a delay period between an end of each injecting and a start of the next resetting.

The resetting can comprise discharging the capacitor to a reset voltage $V_{rst}$ through the first transistor; the pre-charging can charge the capacitor through the first transistor to a first voltage; and the further charging can subsequently charge the capacitor through the second transistor to a second voltage higher than the first voltage.

The method can comprise (1) biasing the first transistor such that the first transistor is switched "on" and conducts charge from or to the capacitor, thereby discharging or resetting the capacitor while biasing the second transistor such that the second transistor is switched "off" and does not conduct charge from or to the capacitor; (2) biasing the first transistor such that the transistor is switched "on" and conducts charge onto the capacitor, thereby pre-charging the capacitor while the second transistor is switched "off"; and (3) biasing the second transistor such that the second transistor is switched "on" and conducts charge onto the capacitor, thereby further charging the capacitor.

The transistors can be field effect transistors and the biasing can be such that (1) the first transistor is in linear resistive regime during the resetting and in a saturation regime and then a sub-threshold regime during the pre-charging; and (2) the second transistor is in a saturation regime and then a sub-threshold regime during or due to the further charging.

The charging can produce a soft reset of the capacitor when the transistors go into a sub-threshold regime during or due to the pre-charging and further charging, and the method can further comprise selecting the biasing in order to increase a time in the soft reset, such that the time in soft reset is maximized, such that a variance of the injected charge is no more than kTC, and/or such that a charge of 10000 times the electron charge or less is injected.

The transistors can be n-MOS transistors, p-MOS transistors, or implemented in CMOS. The first transistor can be connected to the capacitor in a source follower configuration.

The method can further comprise injecting the charge into a photodiode, wherein a read out circuit reads a signal produced in the photodiode in response to radiation incident on the photodiode, the read out circuit determines a feedback or modulation to provide the photodiode in response to the signal, and the read out circuit controls the further charging to set an amount of the injected charge to provide the feedback or modulation to the photodiode.

The feedback or modulation can cancel charge saturation or balance or reduce noise in the photodiode. For example, the readout circuit (e.g., bank of comparators or analog to digital converters in an image sensor) can determine an amount of charge saturation (e.g., produced in the photodiode under high illumination due to radiation saturating the photodiode) and/or noise in the signal, and set/determine an amount of injected charge (e.g., applied to the photodiode) that cancels/reduces the charge saturation and/or reduces the noise in the photodiode and/or signal.

The present invention further discloses a circuit for injecting charge into a circuit node, comprising: (1) a capacitor; (2) a first transistor connected between the capacitor and one or more voltage or current sources, wherein the sources reset the capacitor's voltage and subsequently pre-charge the capacitor through the first transistor; (3) a second transistor connected between the capacitor and a circuit node or output, wherein, after the pre-charging, the capacitor draws charge through the second transistor from the circuit node or output, thereby injecting charge into the circuit node; and (4) one or more control circuits connected to the first transistor and the second transistor to control the voltage or current levels applied to one or more of the transistors' terminals, thereby controlling timing of the reset, the pre-charge, and the injecting, and the amount of injected charge.

The control circuits can comprise an analog to digital converter or bank of comparators, and/or a read out circuit for a photodiode/photodetector.

The present invention further discloses one or more pixels of an image sensor, each pixel comprising one of the circuits connected to a photodiode, wherein the read out circuit reads a signal produced in the photodiode in response to radiation incident on the photodiode, the read out circuit determines a feedback or modulation to provide the photodiode in response to the signal, and the read out circuit determines and sets the current or voltage levels that set the amount of the injected charge that provides the feedback or modulation to the photodiode. For example, the readout circuit can determine an amount of charge saturation (e.g., produced in the photodiode under high illumination due to radiation saturating the photodiode) or noise in the signal and set an amount of injected charge (e.g., applied to the photodiode) that cancels the charge saturation or balances/reduces the noise in the photodiode and/or signal.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

As indicated above, a number of applications, notably in-pixel analog-to-digital conversion based on sigma-delta techniques, require a circuit that can precisely inject a very small amount of charge onto a node.

The injected charge must be low noise, repeatable, controllable, reproducible from cell to cell and insensitive to the node voltage. Furthermore, the circuit must be compact and low power.

Figure 1:
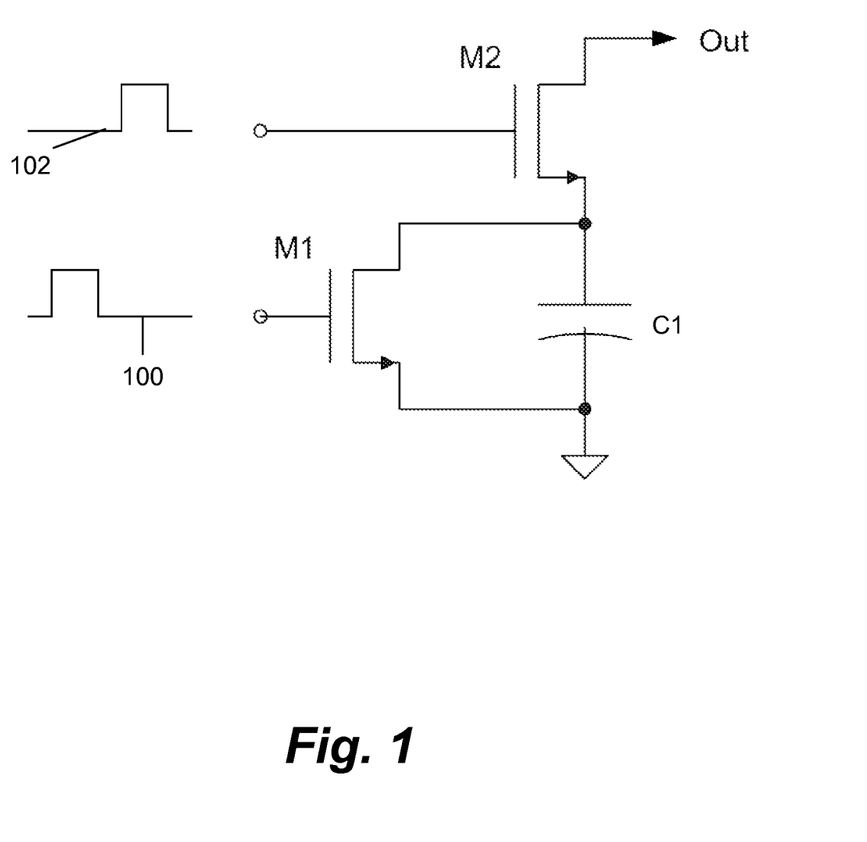
FIG. 1 illustrates a conventional charge injector.

The circuit of FIG. 1 is commonly used, and it is adequate for larger charges. Initially, the capacitor C1 is discharged by use of metal oxide semiconductor field effect transistor (MOSFET) M1 (by applying voltage pulse 100 to the gate of M1). Then, when a charge injection is required, the gate of MOSFET M2 is raised to some voltage, $V_g$ (by applying voltage pulse 102 to the gate of M2). The capacitor C1 is charged to a threshold voltage below $V_g$, and the charge needed to bring the capacitor to this voltage, $Q=C(V_g-V_t)$, is injected (in this case, subtracted) onto the output node (Out) through the drain terminal of M2 ($V_t$ is transistor threshold voltage). Although this circuit meets many of the requirements, it has two drawbacks that limit its use for small charges.

First, since the injected charge depends on the difference of the control voltage $V_g$ and the threshold voltage $V_t$, any uncertainty or variation in the threshold voltage will have a large impact when the control voltage is near the threshold voltage. Second, transistor M1 will inject part of its channel charge onto the capacitor C1 when it is turned off. The amount of this charge will be dependent on the rate at which the gate of M1 is turned off, and so may be poorly controlled.

Figure 2:
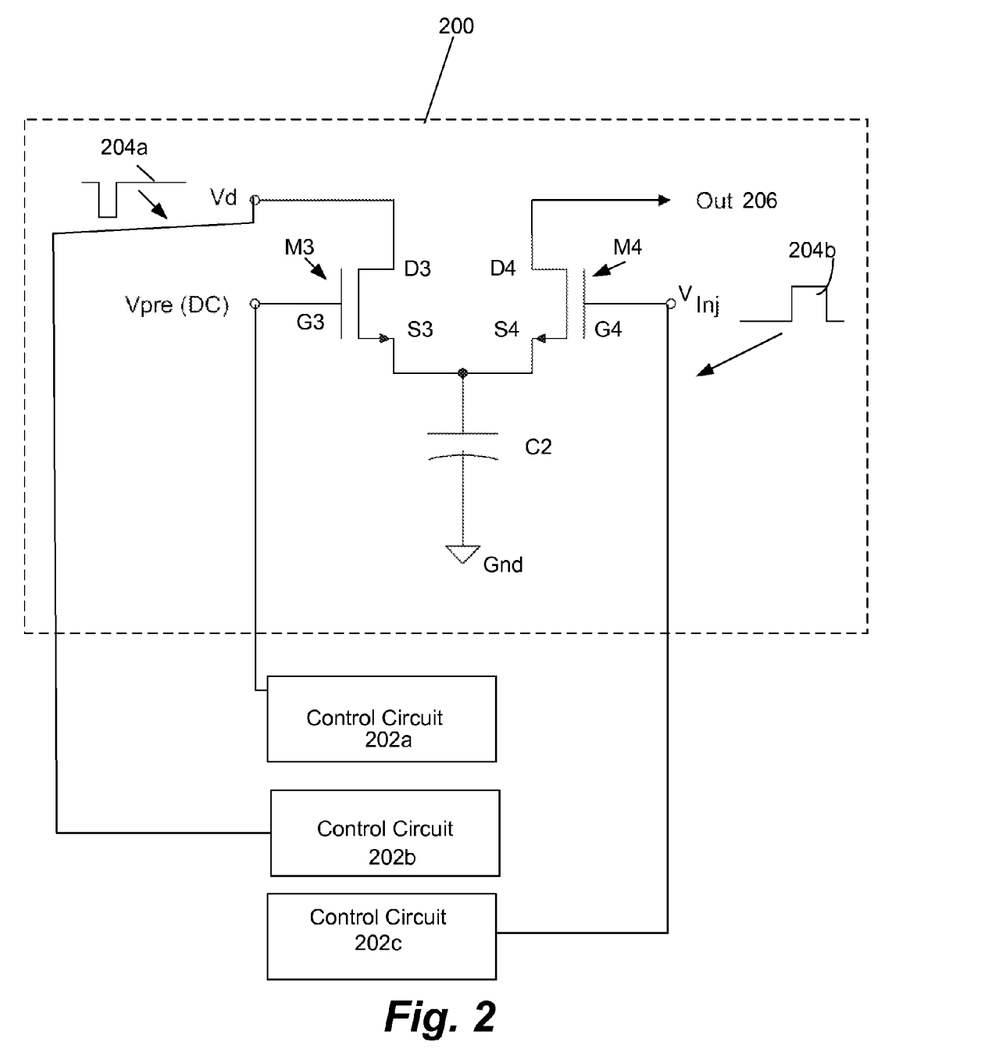
FIG. 2 illustrates a precision charge injector, according to one or more embodiments of the invention.

One or more embodiments of the present invention have developed the circuit 200 of FIG. 2, which includes MOSFETs M3, M4 and capacitor C2, wherein M3 has a gate G3, source S3, and drain D3, and M4 has a gate G4, source S4, and drain D4. An n-type MOSFET (NMOS) implementation is shown, but a p-type MOSFET (PMOS) equivalent can also be made. The circuit of FIG. 2 can be used to inject charges of the order of 10,000 times the electron charge e⁻=1.60217657×10⁻¹⁹ coulombs (C).

In an implementation of the circuit of FIG. 2, the gate G3 of M3 is held at a fixed direct current (DC) voltage, $V_{pre}$, which is above threshold (above threshold voltage $V_{t3}$ of M3), and initially, the gate G4 of M4 is held low (below threshold voltage $V_{t4}$ of M4). In order to reset the circuit, the drain D3 of M3 is first brought to a reset voltage $V_{rst}<V_{pre}-V_{t3}$. M3 then operates in the linear (resistive) regime, and the capacitor C2 is discharged to $V_{rst}$. Then, the drain D3 of M3 is raised to drain voltage $V_d=V_{dd}$, which brings M3 into saturation, and the capacitor C2 is charged to $V_{pre}-V_{t3}$. When an injection is required, the gate G4 of M4 is raised to $V_{inj}>V_{pre}$. The capacitor C2 is charged to $V_{inj}-V_{t4}$ and a charge $Q=C(V_{inj}-V_{pre})$ is injected through the drain of M4. The charge due to resetting has been eliminated, and the injected charge, which depends on the difference of two control voltages $V_{inj}$ and $V_{pre}$, is independent of the threshold voltages $V_{t3}$ and $V_{t4}$, to the extent that the threshold voltages $V_{t3}$ of M3 and $V_{t4}$ of M4 are matched. This differencing will also remove the effects of any voltage drop in the ground return line Gnd.

Also shown in FIG. 2 are one or more control circuits 202a-c for controlling timing and applying DC or waveforms/pulses 204a, 204b to the transistor terminals G3, D3, G4. Also shown is the output Out/206.

A more careful analysis is appropriate, to show how the circuit performs. It should be noted that many of these considerations also apply to the circuit of FIG. 1; both were described above with simplistic models. The charging of a capacitor through a source follower-like circuit with no DC load, such as these, does not stop when the source voltage reaches a threshold voltage below the gate voltage. Rather, the transistor goes into the subthreshold regime, and soft reset ensues. In soft reset, the voltage increases logarithmically with time until it is ultimately limited by leakage current. As a result, the starting point and duration of the soft reset must be carefully controlled in order to achieve repeatable injection. Therefore, the circuit 200 must be reset on every injection cycle, whether or not an injection was done on the previous cycle. Sensitivity to the starting point is suppressed with increasing time in soft reset, so it may be useful to raise $V_{rst}$ so that it is just in the hard reset regime, maximizing the time in soft reset.

Another feature of soft reset is that, due to its nonlinear feedback, it suppresses the kTC reset noise of the capacitor, where k is Boltzmann's constant, T is temperature in Kelvin, and C is capacitance of the capacitor. If the soft reset persists long enough for the voltage to rise several times kT/q, the charge variance on the capacitor is reduced to kTC/2, where q is the charge of the electron ($1.60217657\times10^{-19}$ coulombs (C)). Because there are two soft resets in the cycle, the variance of the final charge injection becomes kTC. If the charge injection is being used to balance an incoming current subject to shot noise, the variance of the equivalent incoming charge is $C\Delta V/q$, where $\Delta V=V_{inj}-V_{pre}$. So long as $\Delta V>kT/q$, the system will be shot noise limited. The precision nature of one or more embodiments of the circuit 200 allows operation with small injections approaching this limit.

Because the only DC path is from the source to the drain, the injected charge will be exactly equal to the change of charge on the capacitor C2, irrespective of the drain voltage. However, the dynamics of the soft reset will be affected by channel length modulation due to the drain voltage, producing a voltage offset of the order $(kT/q)\Delta L/L$, where L is the channel length. Likewise, drain induced barrier lowering (DIBL) may modulate the effective threshold voltage $V_{t4}$ of M4. Therefore, excessively short channel devices should be avoided. Nonetheless, the output impedance will be very high.

The present invention also observes that there will inevitably be some gate-to-drain capacitance that will couple charge to the output as the gate voltage of M4 is switched. However, this is entirely displacement charge, and will result in no net charge transfer after the gate voltage is returned to its initial value. Because, at the end of the soft reset period, M4 will be in deep subthreshold, there will be virtually no channel charge and hence no channel charge injection.

Figure 3:
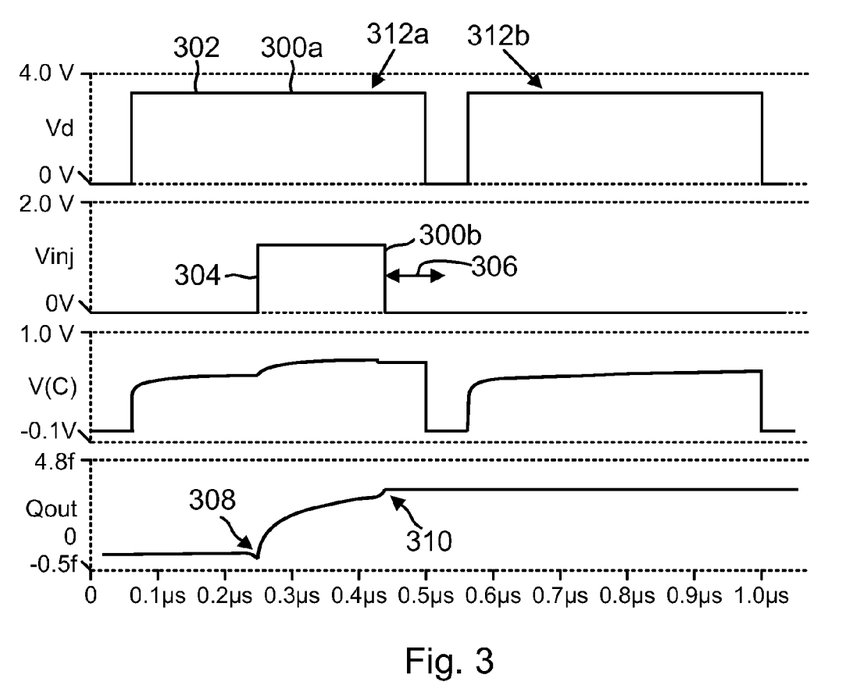
FIG. 3 illustrates simulated precision charge injector waveforms with a 20 femto Farad (fF) capacitor and $V_{inj}-V_{pre}=200$ millivolts (mV), according to one or more embodiments of the invention, showing drain voltage $V_d$, injection Voltage $V_{inj}$, Voltage across the capacitor V(C), and injected charge $Q_{out}$, as a function of time in the cycle, wherein the injected charge is 2.8 fC or 17,000 e⁻ (e⁻=1.60217657×10⁻¹⁹ coulombs (C)), injection is performed on the first cycle, but not on the second, and there are opposite steps in the output charge due to gate-to-drain capacitance at the start and end of the injection.

FIG. 3 shows typical waveforms 300a, 300b for operation of the circuit in FIG. 2. The cycle is divided into four phases. In the first, the capacitor C2 voltage is reset. Next is the precharge phase 302, which commences as soon as M3's drain voltage Vd is raised. Third is the injection phase 304, when M4's gate is raised. The gate G3 and drain D3 of M3 are unchanged. However, the subthreshold current of M3 is rapidly shut off as the source voltage rises. Finally, there must be a delay period 306 between the end of the injection phase 304 and the start of the next reset phase, since any overlap could result in (relatively) very large currents flowing through M4. In FIG. 3, note the opposite steps 308, 310 in the output charge due to gate-to-drain capacitance at the start and end of the injection 304.

The circuit of FIG. 2 is best operated on a continuous, uniform cycle 312a, 312b. If injection is not needed, the gate G4 of M4 is simply held low, while the rest of the cycle 312b is continued. This effectively extends the precharge phase 302, showing why it is essential to reset on every cycle 312a, 312b. An added degree of uniformity can be obtained, if desired, by adding a second injection transistor to perform a dummy injection when an injection is not needed. The dummy injection may be dumped, for instance to the power supply.

Process Steps

Figure 4:
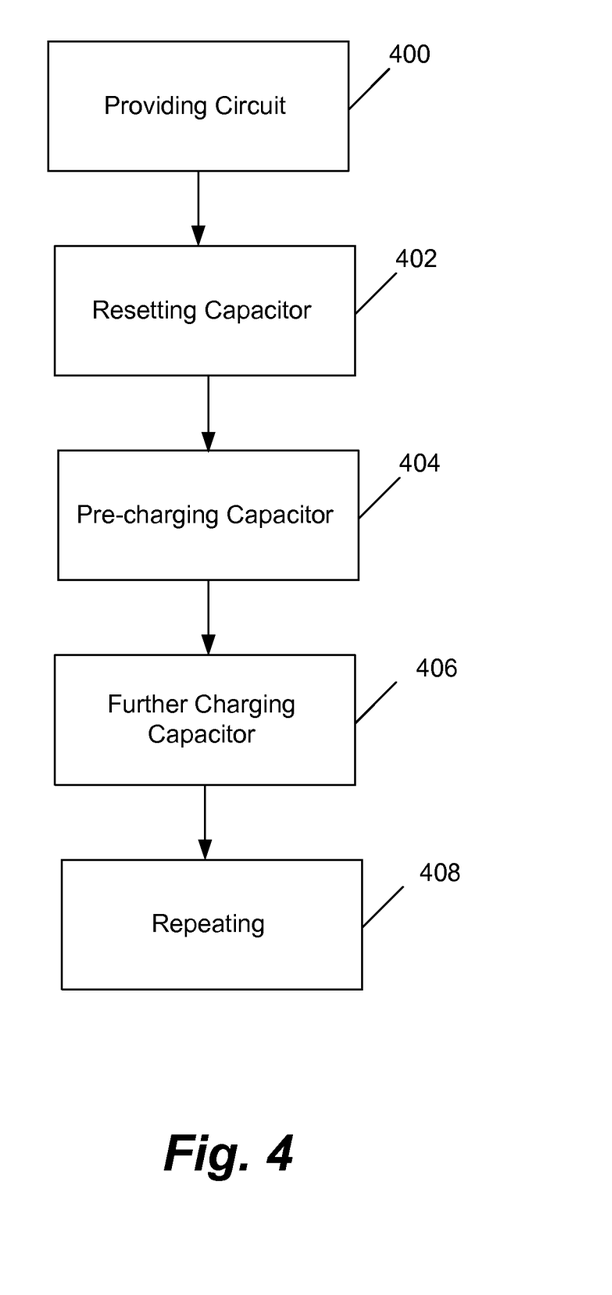
FIG. 4 is a flowchart illustrating a method of injecting charge, according to one or more embodiments of present invention.

FIG. 4 illustrates a method for injecting charge into a circuit node. The method can comprise the following steps.

Block 400 represents providing and initializing a circuit for injecting charge into a circuit node or output. The output of the circuit can be connected to a photodiode in a pixel of an image sensor, for example. The circuit can comprise a first transistor M3, a capacitor C2, and a second transistor M4, as set forth in FIG. 2. The step can comprise biasing a first gate G3 of the first transistor M3 at a fixed voltage $V_{pre}$ above the first transistor's threshold voltage $V_{t3}$; and biasing a second gate G4 of the second transistor M4 at a voltage below the second transistor's threshold voltage $V_{t4}$. The first transistor can be connected to the capacitor in a source follower configuration. The first transistor and the second transistor can be connected to the capacitor in a differential pair configuration.

Block 402 represents resetting the capacitor's voltage through the first transistor.

The step can comprise biasing (e.g., a gate and/or one or more terminals of) the first transistor such that the first transistor is switched "on" and conducts charge (e.g. through the first transistor's channel) from or to the capacitor, thereby discharging or resetting the capacitor, while biasing a second gate of the second transistor such that the second transistor is switched "off" and does not conduct charge (e.g., through its channel) from or to the capacitor.

The resetting can comprise discharging the capacitor to a reset voltage $V_{rst}$ through the first transistor.

The biasing can be such that the first transistor is in linear resistive/ohmic regime (e.g., $V_{GS}>V_{t3}$ and $V_{DS}\leq V_{GS}-V_{t3}$ for M3, where $V_{DS}$ is drain source voltage and $V_{GS}$ is gate source voltage) during the resetting. The transistors can be field effect transistors (FETs) M3, M4 and the resetting can comprise bringing a drain D3 of the first transistor M3 to a reset voltage $V_{rst}<V_{pre}-V_{t3}$ wherein the first transistor M3 operates in a linear resistive regime and the capacitor C2 is discharged to $V_{rst}$.

Block 404 represents, after the resetting, pre-charging the capacitor through the first transistor.

The step can comprise biasing (e.g., a gate and/or one or more terminals of) the first transistor such that the transistor is switched "on" and conducts charge (e.g., through its channel) onto the capacitor, thereby pre-charging the capacitor while the second transistor is switched "off".

The pre-charging can charge the capacitor through the first transistor to a first voltage.

In the case where the transistors include field effect transistors M3, M4, the step can comprise raising the drain D3 of the first transistor M3 to a voltage $V_{dd}$, which brings the first transistor into saturation (e.g., $V_{GS} \geq V_{t3}$ and $V_{DS} > V_{GS} - V_{t3}$) and wherein the capacitor C2 is charged to $V_{pre} - V_{t3}$.

The pre-charging can produce a soft reset of the capacitor C2 when the first transistor M3 goes into a sub-threshold regime (e.g., $V_{GS} < V_{t3}$) due to or during the pre-charging. In this case, the method can further comprise increasing $V_{rst}$ in order to increase a time in the soft reset, or such that the time in soft reset is maximized.

The biasing can be such that the first field effect transistor M3 is in a saturation regime and then a sub-threshold regime during the pre-charging.

Block 406 represents, after the pre-charging, further charging the capacitor through a second transistor, wherein the second transistor is connected between the capacitor and a circuit node (output, out), and the further charging draws charge through the second transistor from the circuit node, thereby injecting charge into the circuit node or output.

The step can comprise biasing (e.g., a gate and/or one or more terminals of) the second transistor such that the second transistor is switched "on" and conducts charge (e.g., through its channel) onto the capacitor, thereby further charging the capacitor.

The further charging can charge the capacitor through the second transistor to a second voltage higher than the first voltage in the pre-charging step.

In the case of where the transistors are field effect transistors M3, M4, the step can comprise raising the second gate of the second transistor M4 to an injection voltage $V_{inj} > V_{pre}$ wherein the capacitor C2 is charged to $V_{inj} - V_{t4}$ and a charge $Q = C(V_{inj} - V_{pre} + V_{t3} - V_{t4})$ is injected through a drain D4 of the second transistor M4 into the circuit node and C is a capacitance of the capacitor.

The threshold voltages of the first transistor M3 and second transistor M4 can be matched such that $V_{t3} = V_{t4}$ and $Q = C(V_{inj} - V_{pre})$. In one or more embodiments, $(V_{inj} - V_{pre} + V_{t3} - V_{t4}) > kT/q$ or $V_{t3} = V_{t4}$ and $(V_{inj} - V_{pre}) > kT/q$.

The biasing can be such that the second field effect transistor M4 is in a sub-threshold regime (e.g., $V_{GS} < V_{t4}$) during the further charging, or in a saturation regime (e.g., $V_{GS} \geq V_{t4}$ and $V_{DS} > V_{GS} - V_{t4}$) and then a sub-threshold regime (e.g., $V_{GS} < V_{t4}$) during the further charging, where $V_{GS}$ is gate source voltage and $V_{DS}$ is drain source voltage.

Channel lengths of the transistors can be selected such that $(V_{inj} - V_{pre} + V_{t3} - V_{t4}) > kT/q$ or $V_{t3} = V_{t4}$ and $(V_{inj} - V_{pre}) > kT/q$ includes contributions due to the channel lengths' modulation by one or more of the drain voltages.

The first transistor, the second transistor, and/or biasing (e.g. $V_{rst}$) can be selected such that the injecting of charge is shot noise limited. For example, the voltages $V_{pre}$, $V_{inj}$, and $V_{rst}$ can be such that the injected charge is 1.65 femtoCoulombs (fC) or less, or 10,000 times an electron charge or less, or 2.8 fC or less, or 17,000 e$^-$ or less (or no more than these charge values).

The first transistor, the second transistor, and/or biasing (e.g., $V_{rst}$) can be selected such that the soft reset persists long enough for the capacitor's voltage to rise several times kT/q to reduce a charge variance on the capacitor to no more than kTC/2 during each of the pre-charging and further charging phases, such that a variance of the injected charge is no more than kTC.

The step can comprise injecting the charge into a photodiode, wherein a read out circuit reads a signal produced in the photodiode in response to radiation incident on the photodiode. The read out circuit can determine a feedback or modulation to provide the photodiode in response to the signal. The read out circuit can control the further charging to set an amount of the injected charge to provide the feedback or modulation to the photodiode.

The feedback or modulation can cancel charge saturation, or balance or reduce noise, in the photodiode. For example, an amount of the injected charge injected into the photodiode can be determined by feedback from the read out circuit, bank of comparators, or analog to digital converter in an image sensor, the feedback can be in response to the signal, and the amount of injected charge can be applied to the photodiode to cancel charge saturation (e.g., produced in the photodiode in response to the radiation or under high illumination).

The gate G3 of M3 can be held at the fixed direct current (DC) voltage, $V_{pre}$ during the resetting 402, pre-charging 404, and further charging 406.

Block 408 represents repeating steps to perform multiple cycles comprising the resetting, precharging, and further charging steps of Blocks 402-406 or the resetting and pre-charging steps of 402-404, and providing a delay period between an end of each injecting and a start of the next resetting.

Figure 5:
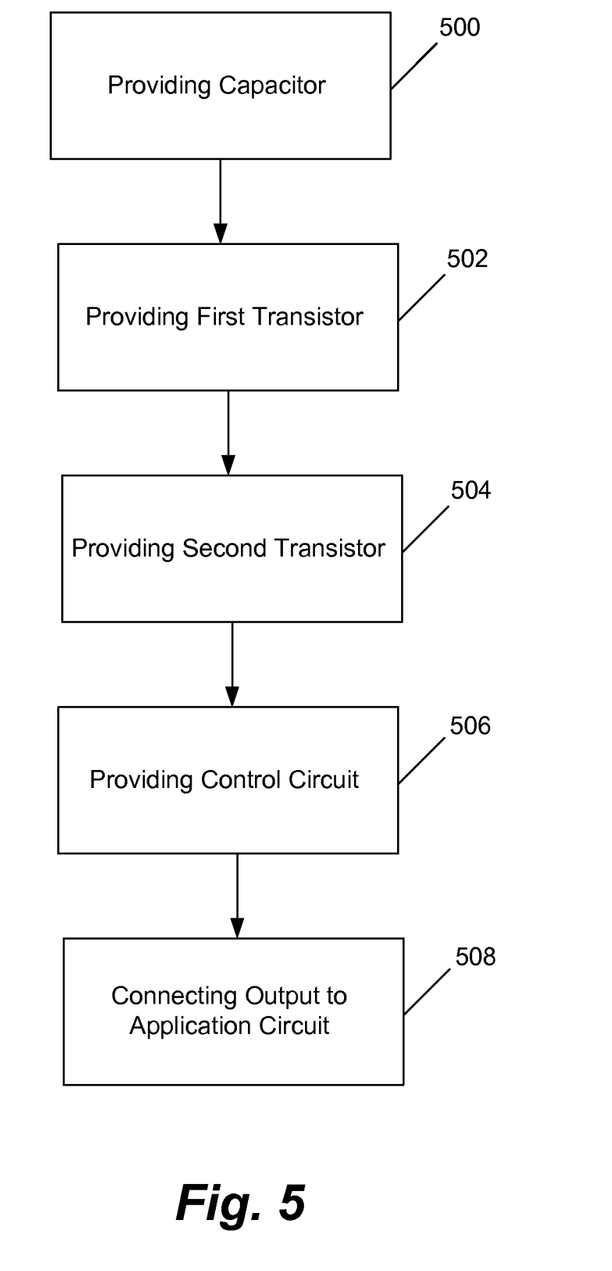
FIG. 5 is a flowchart illustrating a method of fabricating a circuit, according to one or more embodiments of the invention.

FIG. 5 illustrates a method of fabricating a circuit 200 for injecting charge into a circuit node.

Block 500 represents providing a capacitor C2.

Block 502 represents providing a first transistor M3 connected between the capacitor C2 and a voltage/current source or rail, wherein the voltage/current source resets the capacitor's C2 voltage and subsequently pre-charges the capacitor C2 through the first transistor M3.

Block 504 represents providing a second transistor M4 connected between the capacitor C2 and a circuit node out, wherein, after the pre-charging, the capacitor C2 draws charge Q through the second transistor M4 from the circuit node out, thereby injecting charge into the circuit node out.

Block 506 represents providing one or more control circuits 202a-c connected to the first transistor M3 and the second transistor M4 to control bias/current levels applied (via current/voltage sources) to each of the transistor's gates/one or more terminals G3, D3, G4 and thereby control timing and amount of the reset, the pre-charge, and the charge that is injected. The control circuits can be implemented in any number of ways using one or more components, e.g., on/in a chip, computer, microcontroller, comparator, modulator, sigma delta modulator, analog to digital converter, etc. The control circuits can comprise one or more voltage or current sources used to provide the waveforms, pulses, voltage/current levels applied to the terminals in the circuit 200.

The control circuits 202a-c can comprise a read out circuit that reads a signal produced in a photodiode in response to radiation/light incident on the photodiode.

Figure 6:
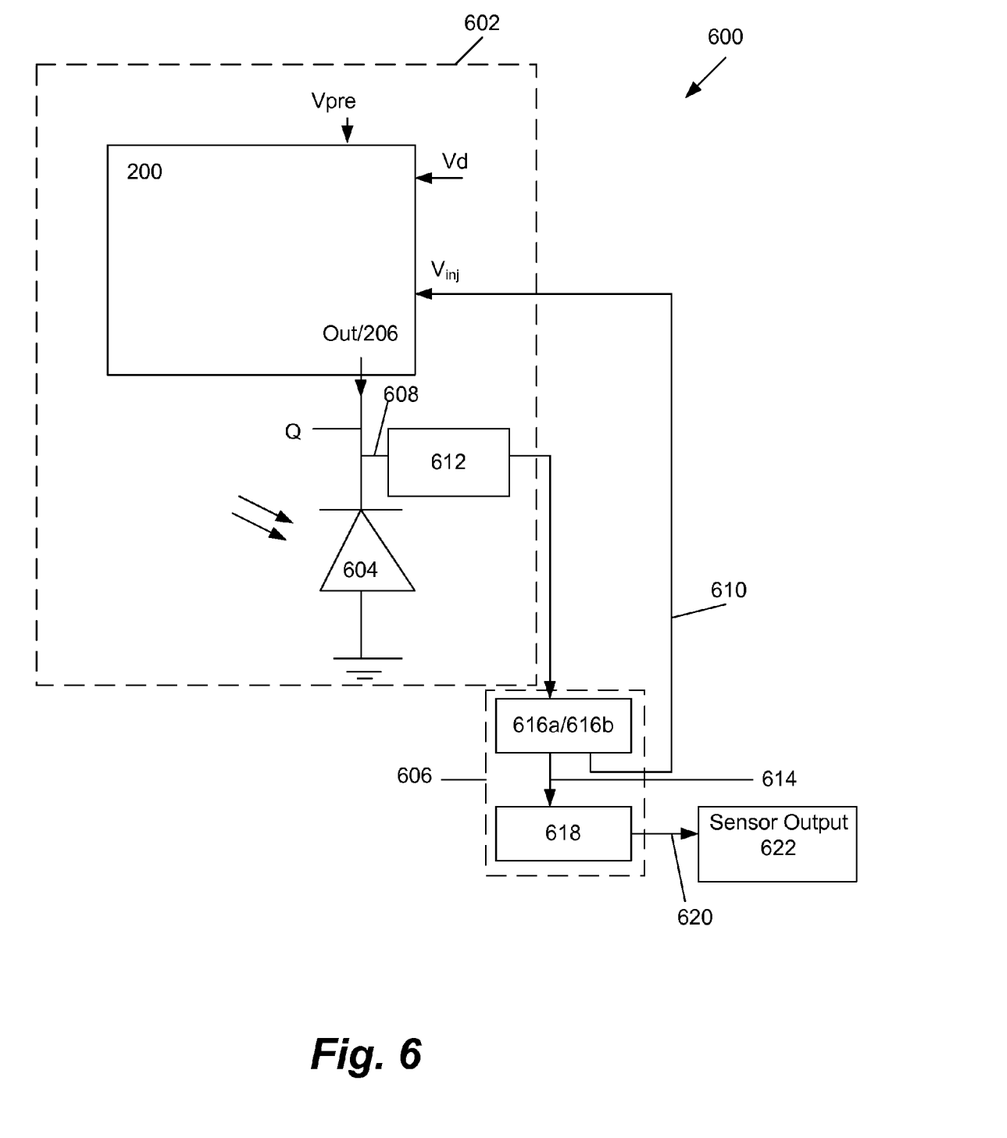
FIG. 6 illustrates an image sensor according to one or more embodiments of the invention.

Block 508 represents connecting the output out 206 to an output circuit, including, for example, a photodiode/photodetector. The photodiode can be in a pixel of an image sensor. FIG. 6 illustrates an image sensor 600 according to one or more embodiments of the invention, comprising one or more pixels 602, each pixel 602 comprising one of the circuits 200 connected to a photodiode 604, the sensor 600 further comprising a read out circuit 606 that reads a signal/waveform 608 produced in the photodiode 604 in response to the radiation/ light/image/illumination incident on a photodiode 604. An amount of the injected charge Q injected in the photodiode 604 from the circuit 200 can be determined by feedback 610 from the read out circuit 606, and the feedback 610 can be in response to, or determined by, the signal 608. For example, the read out circuit 606 can determine a feedback 610 or modulation to provide the photodiode 604 in response to the signal 608, and the read out circuit can determine and set the current or voltage levels (e.g., $V_{inj}$ and/or Vd) that set the amount of the injected charge Q that provides the feedback 610 or modulation to the photodiode 604.

The read out circuit 606 can determine an amount of charge saturation in the signal 608 due to radiation saturating the photodiode 604. The read out circuit 606 can determine an amount of noise (e.g., shot noise) in the signal 608. The read out circuit 606 can then control the further charging wherein an amount of the injected charge Q cancels the charge saturation, or balances or reduces the noise in the photodiode 604 and/or in the signal 608. For example, the read out circuit 606 can determine and set the current or voltage levels (in the transistors of 200) that set the amount of the injected charge Q (applied to each photodiodes 604) that cancels the charge saturation produced in the photodiode 604 under high illumination, and/or balances or reduces the noise in the photodiode 604 and/or signal 608. For example, the read out circuit 606 can set $V_{inj}$, or output the feedback 610 that sets $V_{inj}$, to control the amount of injected charge Q that cancels the charge saturation, and/or balances or reduces the noise, in the photodiode 604 and/or signal 608.

The read out circuit 606 can read the signal 608 produced by the photodiode 604 via buffer and row select transistors 612 (the pixels 602 in the image sensor 600 can be disposed in rows and columns). The read out circuit 606 can comprise an analog to digital converter 616a that converts the analog signal 608 produced in the pixels 602 in response to the radiation incident on the photodiodes 604, into a digital signal 614. The read out circuit 606 can comprise one or more comparators 616b, analog to digital converters, and/or sigma delta modulators, etc. The sigma delta modulators can comprise comparators 616b (determining and outputting the feedback 610 and digital signal 614) and decimator 618 performing decimation of a bit stream in the digital signal 614, before outputting an output signal 620 to the sensor output 622.

The present invention is not limited to applications involving image sensors. For example, one or more embodiments of the present invention can be implemented in any circuit or application where charge injection or precision charge injection is useful.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for injecting charge onto a circuit node, comprising:
   (a) biasing a first gate of a first transistor at a fixed voltage $V_{pre}$ above the first transistor's threshold voltage $V_{t1}$, wherein the first transistor is a field effect transistor;
   (b) biasing a second gate of a second transistor at a voltage below the second transistor's threshold voltage $V_{t2}$, wherein the second transistor is a field effect transistor connected between a capacitor and a circuit node;
   (c) resetting the capacitor's voltage through the first transistor, comprising bringing a drain of the first transistor to a reset voltage $V_{rst} < V_{pre} - V_{t1}$ wherein the first transistor operates in a linear resistive regime and the capacitor is discharged to $V_{rst}$;
   (d) after the resetting, pre-charging the capacitor through the first transistor, comprising raising the drain of the first transistor to a voltage $V_{dd}$, which brings the first transistor into saturation and wherein the capacitor is charged to $V_{pre} - V_{t1}$; and
   (e) after the pre-charging further charging the capacitor through a second transistor, comprising raising the second gate to an injection Voltage $V_{inj} > V_{pre}$ wherein the capacitor is charged to $V_{inj} - V_{t2}$ and a charge $Q = C(V_{inj} - V_{pre} + V_{t1} - V_{t2})$ is injected through a drain of the second transistor onto the circuit node and C is a capacitance of the capacitor.

2. The method of claim 1, wherein the threshold voltages of the first transistor and second transistor are matched such that $V_{t1} = V_{t2}$ and $Q = C(V_{inj} - V_{pre})$.

3. The method of claim 1, wherein:
   $(V_{inj} - V_{pre} + V_{t1} - V_{t2}) > kT/q$ or $V_{t1} = V_{t2}$ and $(V_{inj} - V_{pre}) > kT/q$, where k is Boltzmann's constant, T is temperature, and q is the charge on an electron.

4. The method of claim 1, wherein the pre-charging produces a soft reset of the capacitor when the first transistor goes into a sub-threshold regime during the pre-charging, the method further comprising increasing $V_{rst}$:
   in order to increase a time in the soft reset, or
   such that the time in soft reset is maximized.

5. The method of claim 4, wherein the soft reset persists long enough during the charging steps to reduce a variance of the injected charge to less than kTC.

6. The method of claim 1, wherein the voltages are selected such that the injecting of the charge is shot noise limited.

7. The method of claim 1, wherein the $V_{rst}$, $V_{pre}$, and $V_{inj}$ are such that the injected charge is less than 10,000 times an electron charge.

8. The method of claim 1, further comprising:
   performing multiple cycles comprising the steps (c)-(e) or (c)-(d).

9. The method of claim 1, wherein the field effect transistors are n-MOS transistors, p-MOS transistors, or implemented in CMOS.

10. The method of claim 1, further comprising injecting the charge into a photodiode via the circuit node, wherein:
    a read out circuit reads a signal produced in the photodiode in response to radiation incident on the photodiode,
    the read out circuit determines a feedback to provide the photodiode in response to the signal,
    the feedback comprises the charge Q injected onto the circuit node, and
    the read out circuit controls the feedback to the photodiode.

11. The method of claim 10, wherein the feedback cancels charge produced in the photodiode in response to the radiation.

12. A method for injecting charge onto a circuit node, comprising:
    resetting a capacitor's voltage through a first transistor, comprising biasing the first transistor such that the first transistor is switched "on" and conducts charge from or to the capacitor, thereby discharging or resetting the capacitor while biasing a second transistor such that the second transistor is switched "off" and does not conduct charge from or to the capacitor, after the resetting, pre-charging the capacitor through the first transistor, comprising biasing the first transistor such that the first transistor is switched "on" and conducts charge onto the capacitor, thereby pre-charging the capacitor while the second transistor is switched "off"; and after the pre-charging, further charging the capacitor through a second transistor, comprising biasing the second transistor such that the second transistor is switched "on" and conducts charge onto the capacitor, thereby further charging the capacitor; and wherein:
the second transistor is connected between the capacitor and a circuit node, and
the further charging injects charge through the second transistor onto the circuit node.

13. The method of claim 12, wherein:
the resetting comprises discharging the capacitor to a reset voltage $V_{rst}$ through the first transistor,
the pre-charging charges the capacitor through the first transistor to a first voltage; and
the further charging subsequently charges the capacitor through the second transistor to a second voltage higher than the first voltage.

14. The method of claim 12, wherein the transistors are field effect transistors and the biasing is such that:
the first transistor is:
in a linear resistive regime during the resetting; and
in a saturation regime and then a sub-threshold regime during the pre-charging; and
the second transistor is in a saturation regime and then a sub-threshold regime during the further charging.

15. The method of claim 12, wherein the charging produces a soft reset of the capacitor when the transistors go into a sub-threshold regime during the pre-charging and further charging, the method further comprising selecting the biasing and timing signals applied to the transistor:
in order to increase a time in the soft reset,
such that the time in soft reset is maximized,
such that a variance of the injected charge is less than kTC, and/or
such that the charge of less than 10000 times the electron charge is injected.

16. The method of claim 12, wherein the first transistor and the second transistor are connected to the capacitor in a differential pair configuration.

17. An apparatus for injecting charge onto a circuit node, comprising:
one or more first circuits, each first circuit comprising:
(a) a capacitor having a capacitance C;
(b) a first field effect transistor connected to the capacitor;
(c) a second field effect transistor connected to the capacitor between the capacitor and a circuit node; and one or more second circuits connected to the first transistor and the second transistor in each of the first circuits, to control voltage or current levels applied to transistors via one or more voltage or current sources, wherein the voltage or current levels:
bias first gate of the first field effect transistor at a fixed voltage $V_{pre}$ above the first field effect transistor's threshold voltage $V_{t1}$;
bias a second gate of the second field effect transistor at a voltage below the second field effect transistor's threshold voltage $V_{t2}$;
bring a drain of the first field effect transistor to a reset voltage $V_{rst}<V_{pre}-V_{t1}$ wherein the first field effect transistor operates in a linear resistive regime and the capacitor is reset and discharged to $V_{rst}$;
after the resetting, raise the drain of the first field effect transistor to a voltage $V_{dd}$, which brings the first transistor into saturation, wherein the capacitor is pre-charged to $V_{pre}-V_{t1}$; and
after the pre-charging, raise the second gate to an injection Voltage $V_{inj}>V_{pre}$ wherein the capacitor is charged to $V_{inj}-V_{t2}$ and a charge $Q=C(V_{inj}-V_{pre}+V_{t1}-V_{t2})$ is injected through a drain of the second transistor onto the circuit node.

18. The apparatus of claim 11, further comprising:
one or more pixels of an image sensor, each of the one or more pixels comprising a photodiode connected to one of the circuit nodes, wherein:
the photodiode, in each of the one or more pixels, produces one or more signals in response to radiation incident on the photodiode,
the photodiode, in each of the one or more pixels, receives feedback in response to the one or more signals, and
the feedback comprises the charge Q injected onto the one of the circuit nodes connected to the photodiode.

* * * * *